United States Patent [19]

Cartwright, Jr.

[11] Patent Number: 4,596,938
[45] Date of Patent: Jun. 24, 1986

[54] ELECTRICALLY ERASABLE PROGRAMMABLE ELECTRONIC CIRCUITS USING PROGRAMMABLE-THRESHOLD-VOLTAGE FET PAIRS

[75] Inventor: James M. Cartwright, Jr., Cambria Heights, N.Y.

[73] Assignee: RCA Corporation, Princeton, N.J.

[21] Appl. No.: 627,920

[22] Filed: Jul. 5, 1984

Related U.S. Application Data

[63] Continuation-in-part of Ser. No. 429,468, Sep. 30, 1982, abandoned, and a continuation-in-part of Ser. No. 458,665, Jan. 17, 1983, abandoned.

[51] Int. Cl.⁴ .............................................. G11C 11/40
[52] U.S. Cl. ................................... 307/279; 307/450; 307/451; 307/968; 307/469; 365/185
[58] Field of Search ............... 307/443, 450, 451, 463, 307/465, 468, 469, 471, 279, 291; 364/716; 365/95, 103, 104, 185; 357/23.5

[56] References Cited

U.S. PATENT DOCUMENTS

| | | | |
|---|---|---|---|
| 4,142,251 | 2/1979 | Mintz | 365/181 |
| 4,175,290 | 11/1979 | Harari | 365/156 |
| 4,228,527 | 10/1980 | Gerber et al. | 365/181 |
| 4,495,427 | 1/1985 | Cartwright, Jr. | 307/450 X |
| 4,509,070 | 4/1985 | Furumura | 357/23.5 X |
| 4,516,313 | 5/1985 | Turi et al. | 357/23.5 X |

FOREIGN PATENT DOCUMENTS 0043862 3/1980 Japan .................................. 357/23.5

OTHER PUBLICATIONS

Krick, "Complementary MNOS Electronically Alterable Read-Only Memory", IBM TDB, vol. 13, No. 1, Jun. 1970, pp. 263-264.
Kotecha, "Electrically Alterable Non-Volatile Logic Circuits", IBM TDB, vol. 24, No. 7B, Dec. 1981, pp. 3811-3812.
FET Enchancement/Depletion Logic Circuit, by R. W. Knepper, IBM Technical Disclosure Bulletin, vol. 20, No. 4, Sep. 1977.
"CMOS Technologie-Basis for Die Zukunft", G Auderer der Electtoniker, No. 11, 1981, pp. 53-56.
Patent Abstracts of Japan, vol. 3, No. 99, Jun. 1979, p. 143, E 132, re JPA 54-78679, Fujitsu K. K. Kokai.

*Primary Examiner*—Stanley D. Miller
*Assistant Examiner*—D. R. Hudspeth
*Attorney, Agent, or Firm*—Joseph S. Tripoli; George E. Haas; Allen LeRoy Limberg

[57] ABSTRACT

The series connection between operating voltage terminals of the channels of field effect transistors with electrically alterable threshold voltage, programmed one for conduction and the other for non-conduction in response to programming voltage on their gate-to-gate connection, forms a programmable latch. A pair of such latches, or such a latch and a complementary-pair logic inverter, form a programmable complemented latch. The programmable complemented latch can be used to selectively enable a complementary-pair transmission gate, or to selectively enable a complementary-pair logic inverter, or to alternatively enable a transmission gate and a logic inverter. This last operation can be carried out, for example, in a modified Annis exclusive-OR gate configuration, for selectively inverting or not inverting a logic input.

28 Claims, 13 Drawing Figures

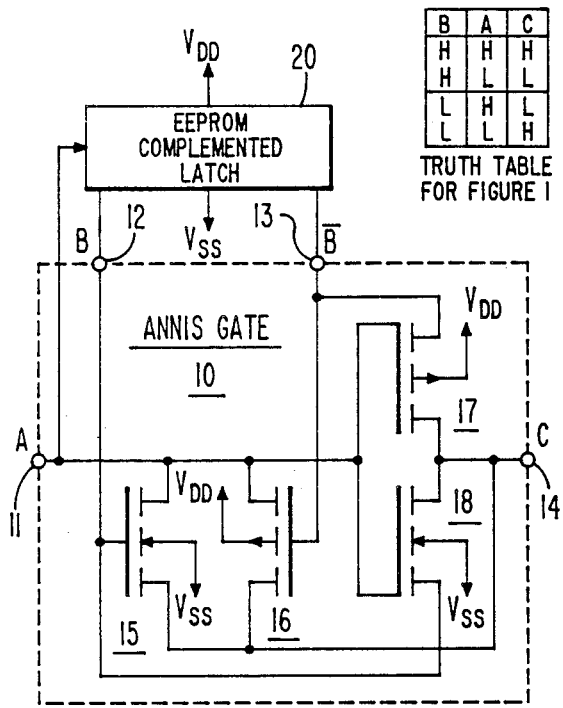
FIG. 1.
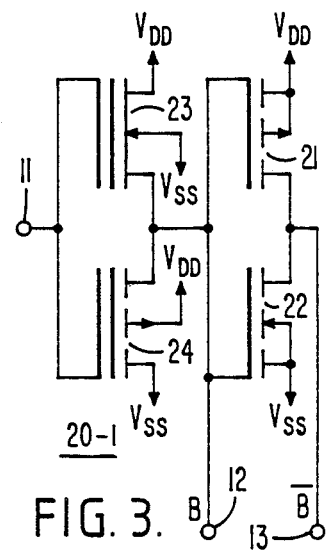
FIG. 2.
FIG. 3.
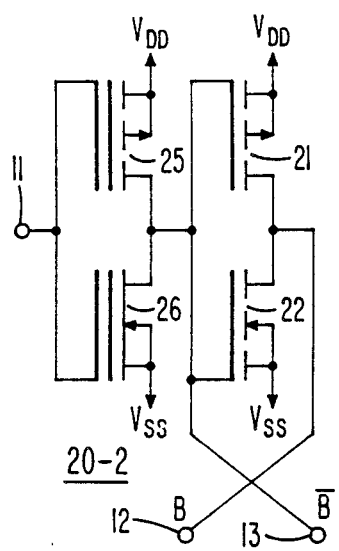
FIG. 4.
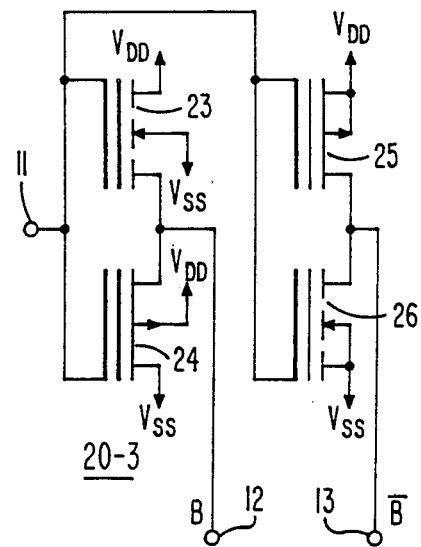
FIG. 5.

NOTE:
* CHANNELS OF 37 & 38 MAY BE REVERSED BETWEEN $V_{SS}$ & $V_{DD}$
** 32 MAY BE OMITTED IF GATE OF 16 TIES TO TERMINAL 34 RATHER THAN TO TERMINAL 13
*** 35 & 36 MAY BE OMITTED AND TERMINALS 34 & 12 TIED

ELECTRICALLY ERASABLE PROGRAMMABLE ELECTRONIC CIRCUITS USING PROGRAMMABLE-THRESHOLD-VOLTAGE FET PAIRS

The government has rights in the invention pursuant to Contract No. DAAK 20-80-C-0292 awarded by the Department of the Army.

This is a continuation-in-part of application Ser. No. 429,468 filed Sept. 30, 1982 and of application Ser. No. 458,665 filed Jan. 17, 1983, both abandoned.

The present invention relates to electrically erasable, electrically programmable electronic circuits for handling digital or analog signals.

BACKGROUND OF THE INVENTION

J. E. Annis in his U.S. Pat. No. 3,500,062 issued March 10, 1970 and entitled DIGITAL LOGIC APPARATUS, included herein by reference, describes complementary-symmetry metal-oxide-semiconductor (COS/MOS or, more simply, CMOS) exclusive-OR and exclusive NOR gates. In these circuits a first of two logic input signals is applied to a simple CMOS push-pull pair logic inverter to obtain its logical complement. This first logic input signal and its complement are then used to selectively enable either a transmission gate or a CMOS push-pull pair logic inverter. When the transmission gate is enabled, it passes the second logic input signal without inversion to the logic output of the gate. When the logic inverter is enabled, it provides inverted response to the second logic input signal at the logic output of the gate.

Recently, field effect transistors have been developed which have electrically alterable threshold voltages, or $V_T$s, which can be programmed by applying voltages between the gate and one of the other electrodes of the device, which voltages exceed those used as normal logic or signal levels. Thereafter, non-volatile memory in these FETs retains the programmed threshold voltage. The present inventor in his U.S. patent application Ser. No. 213,361, filed Dec. 5, 1980 and entitled PROGRAMMABLE LOGIC GATES AND NETWORKS abandoned in favor of a like-titled continuation-in-part application filed March 30, 1983 and patented Jan. 22, 1985 as U.S. Pat. No. 4,495,427, describes programming the threshold voltages of such devices for conditioning them to be strongly enhancement-mode or strongly depletion-mode in their characteristics, thereby to function as either open- or short-circuits to programmably interconnect CMOS field effect transistors into logic gates or networks of logic gates. The programming of the threshold of these devices is carried on by application of programming voltages via the same input terminals used for normal logic inputs. This use of two different regimes of signal for different purposes, but applying them through the same terminals, is referred to as "reflex" operation.

SUMMARY OF THE INVENTION

The present invention in one of its aspects is embodied in an input stage for CMOS integrated circuits which selectively does invert or does not invert signals applied to its input terminal. Programming voltages for determining which mode of operation is to obtain preferably are reflexed through the input terminal. The programming voltages are applied to the gates of a pair of programmable-threshold-voltage FETS arranged in a programmable latch configuration. The channels of these FET's selectively connect a latch output connection to a respective one of two operating voltages. Such programmed latches, per se, are another aspect of the invention. In still another aspect of the invention the latch condition and its complement are applied to control conduction of a CMOS transmission gate. In still another aspect of the invention the latch condition and its complement are used to control application of source voltages to a CMOS logic inverter pair. A transmission gate and a selectively powered logic inverter can be alternately enabled responsive to the latch condition and its complement in embodiments of another aspect of the invention.

BRIEF DESCRIPTION OF THE DRAWING

In the drawing an FET with programmable threshold voltage (or $V_T$) is shown with an additional bar between the two bars respectively signifying the gate electrode and channel portions of the FET, which latter two bars are found in the conventional metal-insulator-semiconductor FET symbol. Where the programmable-$V_T$ transistor is programmable like one of gate-injection type (e.g., is a GIMOS transistor), the space between the additional bar and the bar representing the gate electrode is stippled. Where the programmable-$V_T$ transistor is programmable like one of substrate injection type (e.g., is a SIMOS transistor), the space between the additional bar and the bar representing the channel is stippled. Where the spaces between the additional bar and its flanking two bars are free of stipple, the programmable-$V_T$ transistor is programmable the same as other programmable-$V_T$ transistors (of either programming appearing in the same figure.

In the drawing:

FIG. 1 is a schematic diagram, partially in block form, of an electrically erasable programmable Annis gate in accordance with an aspect of the invention;

FIG. 2 is a truth table for the Annis gate;

Figure 6:
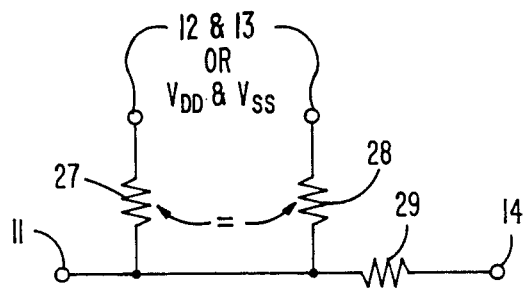
Figure 7:
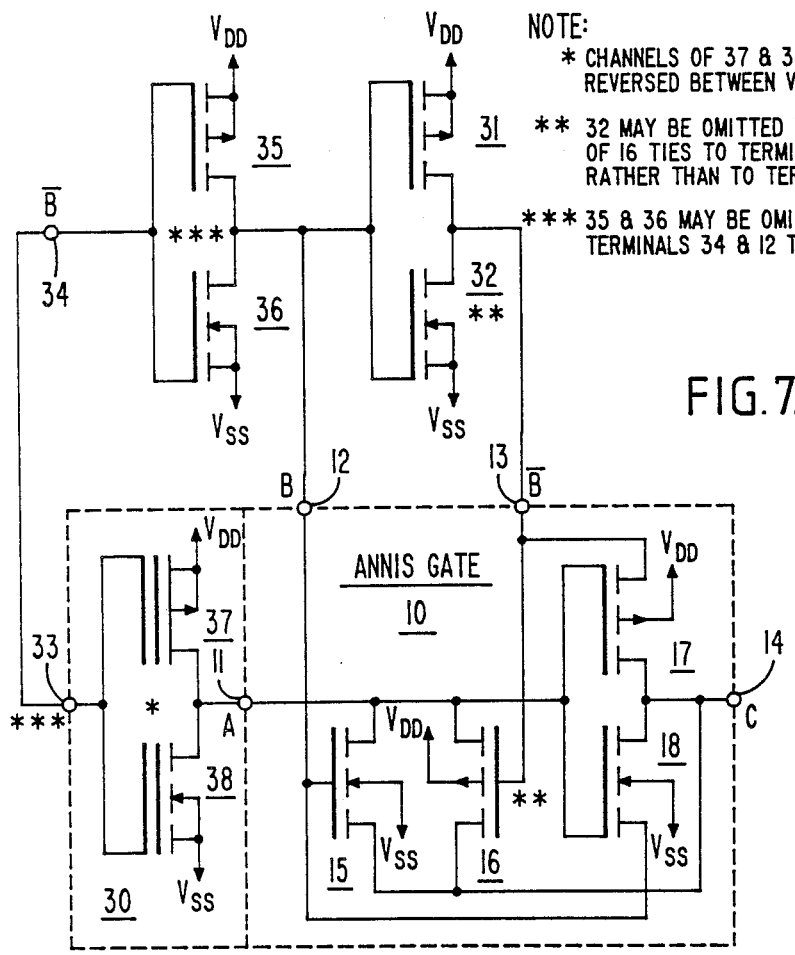

each of FIGS. 3, 4, and 5 is a schematic diagram of a different form the electrically erasable programmable non-volatile memory portion of the FIG. 1 circuit may take in accordance with different embodiments of the invention, each using at least one pair of complementary-conductivity programmable-threshold-voltage FETs;

FIG. 6 is a modification to the FIG. 1 circuit adapting it for programmably inverting or not inverting analog signals;

FIG. 7 is a schematic diagram of alternatives for the FIG. 1 circuitry embodying the invention in others of its aspects; and each of FIGS. 8–13 is a schematic diagram of still different forms the electrically erasable programmable non-volatile memory portion of the FIG. 1 circuit may take, in accordance with different embodiments of the invention, each form using at least one pair of similar-conductivity programmable-threshold-voltage FET's.

In FIG. 1, an Annis gate 10 is arranged for receiving a logic variable A on its input terminal 11 from a source not explicitly shown and for receiving another logic variable B and its complement $\bar{B}$ on its input terminals 12 and 13, respectively. Logic response $C = A \oplus B$ appears at output terminal 14 of gate 10 in accordance with FIG. 2 truth table, wherein the letters H and L refer respectively to high and to low logic conditions. The symbol $\oplus$ signifies the exclusive-NOR response to A and B.

The departure from prior art practice in the operation of Annis gate 10 is that the B and $\bar{B}$ logic variables are supplied from a complemented latch circuit 20 which includes electrically erasable programmable read only memory (EEPROM) elements, and the logic conditions B and $\bar{B}$ are specified in accordance with programming signals applied to terminal 11 at an earlier time. This means the Annis gate 10 can be programmed by application of a programming potential outside the normal range of logic signals to subsequently generate C either equal to A or to $\bar{A}$. The limits of a normal range of logic signals may be a relatively low voltage L which may equal supply voltage $V_{SS}$ and a relatively high voltage H which may equal supply voltage $V_{DD}$.

In Annis gate 10 an n-channel enhancement-mode field effect transistor 15 and a p-channel enhancement-mode field effect transistor 16 are connected together as a complementary-pair transmission gate between terminals 11 and 14. When latch 20 supplies B=H and $\bar{B}$=L, B being high biases the gate of n-channel FET 15 to tend to be conductive for A<H, and $\bar{B}$ being low biases the gate of p-channel FET 16 to tend to be conductive for A>L. The transmission gate connection of FETs 15 and 16 between terminals 11 and 14 is conductive over the entire range of normal logic levels bounded by H and L, so C=A. When latch 20 supplies B=L and $\bar{B}$=H, B being low fails to bias the gate of n-channel FET 15 to be conductive at any logic level in the normal range, and $\bar{B}$ being high fails to bias the gate of p-channel FET 16 to be conductive at any logic level in the normal range. The transmission gate connection of FETs 15 and 16 between terminals 14 and 11 is therefore non-conductive.

In Annis gate 10, a p-channel enhancement-mode FET 17 and an n-channel enhancement-mode FET 18 have their gates connected at input terminal 11 and their drains connected at output terminal 14. When the sources of p-channel FET 17 and of n-channel FET 18 to which $\bar{B}$ and B are respectively applied are high and low, respectively, a complementary-pair logic-inverter stage is enabled between input terminal 11 and output terminal 14. So C=$\bar{A}$. (Conventionally in CMOS logic design, the logic levels L and H are closer together in voltage than the sum of the threshold voltages of the p-channel and n-channel enhancement mode FETs used to implement the design. This reduces dissipation in that only FET 17 can conduct responsive to A=L and only FET 18 can conduct responsive to A=H.) When B=H and $\bar{B}$=L on the other hand, the complementary-pair logic-inverter connection of FETs 17 and 18 is non-operative, since normal logic levels do not apply forward source-to-gate potential to either FET.

Beginning with the FIG. 3 configuration, consider now forms 20-1, 20-2, 20-3 the complemented latch circuit may take to facilitate its being programmed via terminal 11. In FIGS. 3 and 4 the B logic function is complemented to $\bar{B}$ by a complementary-pair logic inverter connection of p-channel, enhancement-mode FET 21 and n-channel, enhancement-mode FET 22. The logic levels H and L are identifiable with the positive and negative operating voltages $V_{DD}$ and $V_{SS}$, respectively, in FIG. 3 and the figures that follow. The derivation of B from programming voltages applied via terminal 11 involves the electrically-erasable programming process.

An n-channel FET 23 and a p-channel FET 24 of FIG. 3 are each of a type in which the threshold voltage of the FET is electrically programmable by the potential between its gate and another of its electrodes being substantially larger than the range of normal logic level swing. FET 23 and FET 24 are shown as being depletion-mode and enhancement-mode, respectively, in FIG. 3. That is, as they would be after a large voltage, substantially more positive than $V_{DD}$ in the case of gate-injection devices, or substantially more negative than $V_{SS}$ in the case of substrate-injection devices, has been most recently applied as programming voltage via terminal 11. The application of these large programming voltages of one polarity or the other is carried out before periods of normal operation. During such a programming period before a period of normal operation, to forestall possibilities of misprogramming, it is generally preferred practice to place $V_{SS}$, $V_{DD}$ and substrate connections at a reference potential against which programming voltages are referred. After programming, the $V_{SS}$, $V_{DD}$ and substrate connections are referred to the values shown for normal operation, and the potential on terminal 11 is constrained to the range between $V_{SS}$ and $V_{DD}$ inclusive. (This practice is mandatory with certain types of programmable-$V_T$ FETs.) In the period of normal operation illustrated by FIG. 3, FET 23 is conditioned to be so far into its depletion-mode conduction characteristics that its channel is in effect a short circuit to $V_{DD}$, no matter what value of A between L=$V_{SS}$ and H=$V_{DD}$ inclusive is applied to its gate during normal operation. FET 24 is conditioned to be so far into its enhancement-mode conduction characteristics that its channel is non-conductive, no matter what value of A between L=$V_{SS}$ and H=$V_{DD}$ inclusive is applied to its gate during normal operation. So, B=$V_{DD}$=H. Consequently, the complementary-pair logic inverter connection of FETs 21 and 22 responds to supply $\bar{B}$=$V_{SS}$=L. Annis gate 10 is conditioned by B=H and $\bar{B}$=L to be non-inverting, with output response C=A.

When the programming voltage last applied via terminal 11 to the gates of FETs 23 and 24 has been a large voltage, substantially more negative than $V_{SS}$ in the case of gate-injection devices or substantially more negative than $V_{SS}$ in the case of substrate-injection devices, FETs 23 and 24 will instead be conditioned to be strongly enhancement-mode and strongly depletion-mode, respectively. So strongly so, that for all values of A between L=$V_{SS}$ and H=$V_{DD}$ inclusive applied to the gates of FETs 23 and 24, the channel of FET 23 will be non-conductive and the channel of FET 24 will be a short circuit to $V_{SS}$. So, B=$V_{SS}$=L, and consequently $\bar{B}$=$V_{DD}$=H. Annis gate 10 is conditioned by B=L and $\bar{B}$=H to be inverting, with output response C=$\bar{A}$.

The latch connection of common-drain FETs 23 and 24 with gate-to-gate connection for receiving programming voltages and source-to-source connection as output connection, per FIG. 3, works with types of FET programmable by voltage between gate electrode and drain electrode, by voltage between gate electrode and joined drain and source electrodes, or by voltage between gate electrode and substrate. E.g., it works with gate-injection metal-oxide-semiconductor (GIMOS) FETs or with substrate-injection metal-oxide-semiconductor (SIMOS) FETs. This latch connection of FETs 23 and 24, the FIG. 3 complemented latch circuit, the FIG. 3 complemented latch circuit in combination with the complementary-pair transmission gate, and the FIG. 3 complemented latch circuit in combination with the complementary-pair inverter (from which combination FET 22 may also be omitted), as well as the dual of this last circuit, are aspects of the invention useful in themselves for implementing the design of circuitry other than that shown.

FIG. 4 shows a modification 20-2 of the FIG. 3 complemented latch circuit 20-1 wherein the latch configuration of common-drain FETs 23 and 24 interconnected at their source electrodes is replaced by a latch configuration of common-source FETs 25 and 26 interconnected at their drain electrodes. FETs 25 and 26 are p-channel and n-channel, respectively, insofar as conduction type is concerned; and they have electrically alterable threshold voltages programmed by application of large programming voltage between their gate electrodes and their source electrodes (or possibly between their gate electrodes and their substrates). E.g., they may be GIMOS or SIMOS FETs. FET's 23 and 26 are shown as having been so strongly conditioned for enhancement-mode operation and for depletion-mode operation respectively that for $V_{SS} < A < V_{DD}$ the channel of FET 25 is non-conductive and the channel of FET 26 is in effect a short-circuit to $V_{SS}$. This, in response to a programming voltage substantially more positive than $V_{DD}$ in the case of gate-injection devices, or substantially more negative than $V_{SS}$ in the case of substrate-injection devices. Responsive to a programming voltage substantially less negative than $V_{SS}$ in the case of gate injection devices, or substantially more positive than $V_{DD}$ in the case of substrate-injection devices, FET 26 can be programmed to be non-conductive and FET 25 can be programmed to be in effect a short circuit to $V_{DD}$. The latch circuit connection of FETs 25 and 26, the FIG. 4 complemented latch circuit in combination with the complementary pair inverter, as well as modifications of this circuit similar to those described with respect to its analog using the FIG. 3 complemented latch circuit in modified form are aspects of the invention useful in themselves for implementing the design of circuitry other than that shown.

FIG. 5 shows a complemented latch circuit 20-3 comprising the programmable latch connection of common-drain FETs 23 and 24 and the programmable latch connection of common-source FETs 25 and 26, both responding to programming voltages at terminal 11 to supply B and $\bar{B}$ to terminals 12 and 13, respectively, without need for a complementary-pair logic inverter. Assuming FETs 23, 24, 25 and 26 to be gate-injection types, and assuming the last applied programming voltage to be substantially more negative than $V_{SS}$, operation is as follows. The programming has biased p-channel FETs 23 and 26 strongly into enhancement-mode operation to open-circuit their channels for normal logic levels to their gates. The programming has biased n-channel FETs 24 and 25 strongly into depletion-mode operation, to short-circuit their channels for normal logic levels to their gates. A programming voltage substantially more positive than $V_{DD}$ can be used to open-circuit the channels of FETs 24 and 25 and short-circuit those of FETs 23 and 26 for application of normal logic levels to their gates. The FIG. 5 complemented latch circuit and the combinations of it with a complementary-pair transmission gate and with a complementary complementary-pair logic inverter are aspects of the invention useful in themselves for implementing the design of circuitry other than that shown.

The programmable latches 20-1, 20-2 and 20-3 can be modified to replace FETs 23, 24, 25 and 26 with FETs having threshold voltages programmable in response to programming voltage between their gate electrodes and their joined drain and source electrodes. To implement their programming $V_{DD}$ and $V_{SS}$ during programming are each made equal to a reference potential, and the latch output connections are provided with a clamp to the reference potential. Such clamp can be provided by the selectively conductive channel of an FET rendered conductive only during programming.

Adaptations may be made to the FIG. 1 circuit which arrange its terminals 11 and 14 to be biased midway between $V_{SS}$ and $V_{DD}$ and absent the application of either programming voltages or other input voltages to input terminal 11. This is advantageous when it is desired to selectively invert or not invert an analog signal, for example.

FIG. 6 illustrates how such adaptation can be made. Equal-value resistance 27 and 28 average either $\bar{B}$ and B or $V_{DD}$ and $V_{SS}$ to bias terminal 11 midway between $V_{SS}$ and $V_{DD}$. A resistance 29 provides for centering the quiescent voltage at terminal 14 midway between $V_{SS}$ and $V_{DD}$.

FIG. 7 shows a programmable latch 30 used to provide programmed A signal to the A input terminal 11 of Annis gate 10. A p-channel enhancement-mode FET 31 and an n-channel enhancement-mode FET 32 are connected as a complementary-pair logic inverter for generating $\bar{B}$ signal responsive to B signal, which B and $\bar{B}$ signals are applied to terminals 12 and 13 of Annis gate 10. Programmable latch 30 can receive programming voltages via its input connection 33 and B input signal can be applied directly from connection 33 to terminal 12; or, as shown in FIG. 7 programmable latch 30 can receive programming voltages and $\bar{B}$ input signal via a terminal 34, with the $\bar{B}$ signal at terminal 33 being inverted to provide B signal to terminal 12. This inversion is performed in FIG. 7 using the complementary-pair logic inverter connection of p-channel enhancement-mode FET 35 and n-channel enhancement-mode FET 36. The p-channel FET 37 and n-channel FET 38 in programmable latch 30 are preferably of the type having their $V_{T}$s programmed responsive to programming voltages applied between their gate and source electrodes, when their channels are connected between $V_{DD}$ and $V_{SS}$ in the order shown in FIG. 7.

Modifications that can be made to the FIG. 7 configuration include the following ones. N-channel FET 32 can be omitted if $\bar{B}$ is supplied from terminal 33 to the gate of n-channel FET 16 in the transmission gate connection with p-channel FET 15, rather than being supplied from terminal 13. The order of the connecting of the external circuit to terminals 12 and 13 of Annis gate can be reversed; and this modification can be carried further either to connect terminals 13 and 34 and eliminate FETs 35 and 36, or to eliminate FET 31 by connecting the gate of FET 15 to terminal 34 rather than to terminal 13.

Variants of FIG. 7 or any of its foregoing modifications are feasible in which there is reversal in programming latch 30 of the positions of the channels of programmable-threshold-voltage p-channel FET 37 and of programmable-threshold-voltage n-channel FET 38. The FETs 37 and 38 must then be types with $V_{T}$s programmable in response to programming voltages applied between gate and drain. There will be an attendant reversal of the polarity programming voltages to establish either output condition of the programmable latch.

Arrangements can be made for clamping the source and drain electrodes of the FETs 37 and 38 during their programming, to allow each to be of a type programmed by voltage between its gate and the one of its source and drain electrodes not directly connected to a supply voltage. During programming the $V_{DD}$ and $V_{SS}$ will both be made equal to a reference voltage.

In the programmable latch circuits embodying the invention as thus far described, alternative connection of an output terminal to $V_{SS}$ or to $V_{DD}$ has been made using a pair of programmable-$V_T$ transistors of complementary conductivity types, but of similar programming type. Programmable latch circuits embodying the invention can make alternative connection of an output terminal to $V_{SS}$ or to $V_{DD}$ using a pair of programmable-$V_T$ transistors of similar conductivity type, but of complementary programming types.

Figure 8:
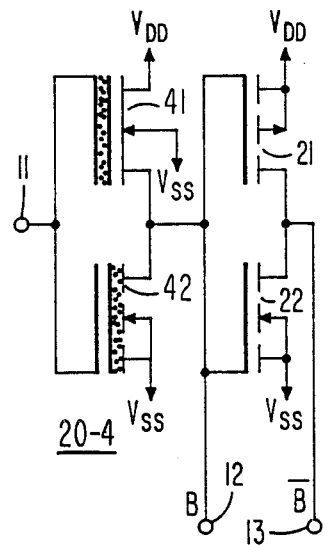

An n-channel GIMOS FET 41 and an n-channel SIMOS FET 42 of FIG. 8 are each of a type in which the threshold voltage of the FET is electrically programmable by the potential between its gate and another of its electrodes being substantially larger than the range of normal logic level swing. FET 41 and FET 42 are shown as being depletion-mode and enhancement-mode, respectively, in FIG. 8 as they would be after a large voltage, substantially more positive than $V_{DD}$ has been most recently applied as programming voltage via terminal 11. FET 41 is conditioned to be so far into depletion-mode conduction characteristics that its channel is in effect a short circuit to $V_{DD}$, no matter what value of A between $L=V_{SS}$ and $H=V_{DD}$, inclusive, is applied to its gate. FET 42 is conditioned to be so far into its enhancement-mode conduction characteristics that its channel is non-conductive, no matter what value of A between $L=V_{SS}$ and $H=V_{DD}$, inclusive is applied to its gate. So, $B=V_{DD}=H$. Consequently, the complementary-pair logic inverter connection of FETs 21 and 22 responds to supply $\overline{B}=V_{SS}=L$. Annis gate 10 is conditioned by $B=H$ and $\overline{B}=L$ to be non-inverting, with output response $C=A$.

When the programming voltage last applied via terminal 11 to the gates of FETs 41 and 42 has been a large voltage, substantially more negative than $V_{SS}$, however, FETs 41 and 42 will be continued to be strongly enhancement-mode and strongly depletion-mode, respectively. So strongly so, that for all values of A between $L=V_{SS}$ and $H=V_{DD}$, inclusive, applied to the gates of FETs 41 and 42, the channel of FET 41 will be non-conductive and the channel of FET 42 will be a short circuit to $V_{SS}$. So, $B=V_{SS}=L$, and consequently $\overline{B}=V_{DD}=H$. Annis gate 10 is conditioned by $B=L$ and $\overline{B}=H$ to be inverting, with output response $C=\overline{A}$.

GIMOS FET 41 preferably has its floating gate structure so made that the device is programmably responsive to programming voltage between gate and drain electrodes, without need for clamping terminal 12 (to which its source connects) to a reference voltage during programming. SIMOS FET 42 preferably has its floating gate structure so made that the device is programmably responsive to progamming voltage between gate and source electrodes, or gate and substrate electrodes, without need for clamping terminal 12 (to which its drain connects) to a referenoe voltage during programming. Where the GIMOS FET 41 is of a type the source electrode of which must be clamped to a reference potential during programming, or where the SIMOS FET 42 is of a type the drain electrode of which must be clamped to potential during programming, the clamp is simply provided by the selectively conductive channel of an FET rendered conductive responsive to a control signal applied to its gate electrode during programming. An FET of suitable conductivity type and high enough effective threshold voltage (of its own or aided by a potential-offsetting device in its gate connection) can have the programming voltage at terminal 11 applied as this control signal. The latch connection of FETs 41 and 42, the FIG. 8 complemented latch circuit, the FIG. 8 complemented latch circuit in combination with the complementary-pair transmission gate, and the FIG. 8 complemented latch circuit in combination with the complementary-pair inverter (from which combination FET 22 may also be omitted), are aspects of the invention useful in themselves for implementing the design of circuitry other than that shown.

Figures 9, 10:
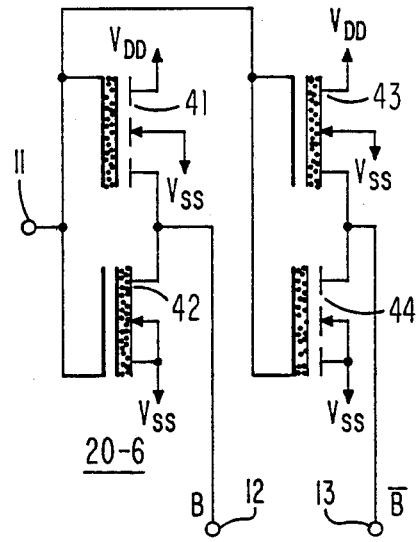

FIG. 9 shows a modification 20-5 of the FIG. 8 complemented latch circuit 20-4 wherein the latch configuration of common-drain GIMOS FET 41 and common-source SIMOS FET 42 is replaced by a latch configuration of common-drain SIMOS FET 43 and common-source GIMOS FET 44. FETs 43 and 44 are both n-channel. SIMOS FET 43 preferably has its floating gate so made as to be that the transistor is responsive to programming voltage between gate and drain electrodes, and GIMOS FET 44 preferably has its floating gate so made as to be responsive to programming voltage between gate and source electrodes; this makes clamping of the interconnection node between FETs 43 and 44 unnecessary. FETs 43 and 44 are shown as having been so strongly conditioned for enhancement-mode operation and for depletion-mode operation respectively that for $V_{SS}<A<V_{DD}$ the channel of FET 44 is in effect a short-circuit to $V_{SS}$. This, in response to a programming voltage substantially more positive than $V_{DD}$. Responsive to a programming voltage substantially more negative than $V_{SS}$, FET 44 can be programmed to be non-conductive and FET 43 can be programmed to be in effect a short circuit to $V_{DD}$. The latch circuit connection of FETs 43 and 44, the FIG. 9 complemented latch circuit, the FIG. 9 complemented latch circuit in combination with the complementary pair inverter are aspects of the invention useful in themselves for implementing the design of circuitry other than that shown.

FIG. 10 shows a complemented latch circuit 20-6 comprising the programmable latch connection of FETs 41 and 42 and the programmable latch connection of FETs 43 and 44, both responding to programming voltages at terminal 11 to supply B and $\overline{B}$ to terminals 12 and 13, respectively, without need for a complementary-pair logic inverter. The last applied programming voltage, substantially more positive the $V_{DD}$, has biased FETs 41 and 44 strongly into enhancement-mode operation to open-circuit their channels for normal logic levels at their gates and has biased FETs 42 and 43 strongly into depletion-mode operation to short-circuit their channels for normal logic levels at their gates. A programming voltage substantially more negative than $V_{SS}$ can be used to open-circuit the channels of FETs 42 and 43 and short circuit those of FETs 41 and 44 for application of normal logic levels to their gates. The FIG. 10 complemented latch circuit and the combinations of it with a complementary-pair transmission gate and with a complementary-pair logic inverter are aspects of the invention useful in themselves for implementing the design of circuitry other than that shown.

Figure 11:
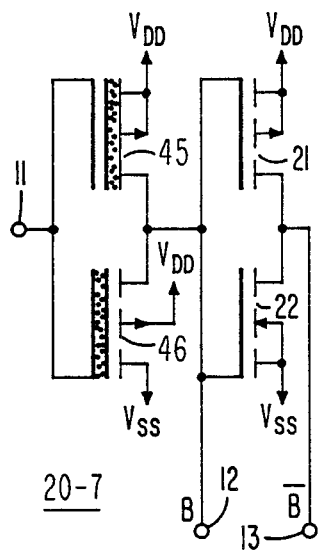
Figure 12:
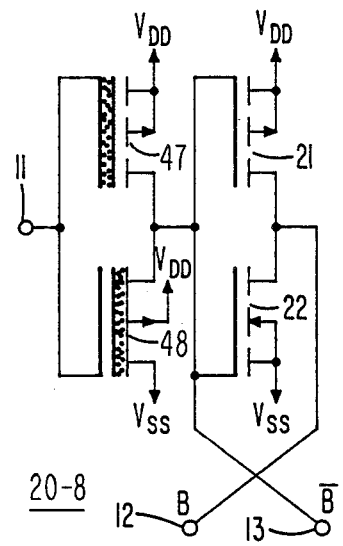
Figure 13:
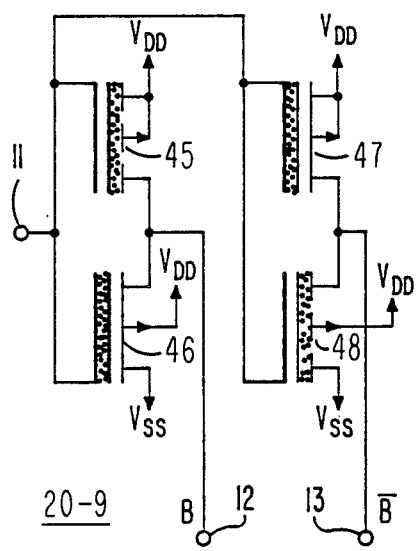

The FIGS. 8, 9 and 10 programmable latches 20-4, 20-5 and 20-6 each use n-channel programmable-threshold-voltage transistors; and they have homologs 20-7, 20-8 and 20-9 using p-channel programmable-threshold-voltage transistors 45, 46, 47 and 48 as shown in FIG. 11, 12 and 13, respectively.

Like the programmable latches 20-1, 20-2 and 20-3 of FIGS. 3, 4 and 5, the programmable latches of FIGS. 8, 9, 10, 11, 12 and 13 are advantageous in that they consume no appreciable power except during programming.

In FIG. 10 the n-channel FETs of SIMOS type may both be replaced by p-channel FETs of GIMOS type, or the n-channel FETs of GIMOS type may both be replaced by p-channel FETs of GIMOS type, or the p-channel FETs of GIMOS type may both be replaced by n-channel FETs of SIMOS type.

In the claims which follow, the class of metal-insulator-semiconductor transistors specified as being of gate-injection type is to be construed to include other programmable-threshold-voltage FETs with conduction characteristics electrically programmed and erased similarly to GIMOS FET; such as programmable injection (PIMOS) types and the class of metal-insulator-semiconductor transistors specified at being of substrate-injection type is to be contrued to include other programmable-threshold-voltage FETs with conduction characteristics electrically programmed and erased similarly to SIMOS FETs.

What is claimed:

1. An electrically programmable latch circuit including an input terminal, an output terminal from which a first latch output signal is supplied, first and second operating supply terminals, and means for selectively connecting said output terminal to a selected one of said first and second operating supply terminals during times of normal operation responsive to whether programming voltages, voltages of prescribed amplitudes applied between said input terminal and each of said first and second operating supply terminals prior to times of normal operation, are positive or are negative, said means comprising:

means for supplying during said times of normal operation to said first operating supply terminal, to said second operating supply terminal and to said input terminal, respectively, a relatively positive operating supply voltage, a relatively negative operating supply voltage, and potential in the range between said relatively positive and relatively negative operating supply voltages inclusive of them, the difference of the potential then supplied to said input terminal from the relatively positive operating supply voltage having a substantially smaller value than the prescribed amplitude of positive programming voltage, and the difference of the potential then supplied to said input terminal from the relatively negative operating supply voltage having a substantially smaller value than the prescribed amplitude of negative programming voltage; and first and second programmable-threshold-voltage transistors having respective channels connected at their first ends without substantial intervening elements to said output terminal and respectively connected at their second ends without substantial intervening elements to different ones of said first and second operating supply terminals, having respective gate electrodes connected to said input terminal, and being of types having threshold voltages alterable responsive to said programming voltages and retentive of their threshold voltages during said times of normal operation when the differences of potential applied to said input terminal from said operating supply voltages have said substantially smaller values, said first and second programmable-threshold-voltage transistors being of respective types with channel conduction characteristics conditioned by positive programming voltage to be so far into depletion-mode and enhancement-mode respectively as to be relatively conductive and relatively non-conductive respectively, said first and second programmable-threshold-voltage transistors being of respective types with channel conduction characteristics conditioned by negative programming voltage to be so far into enhancement-mode and depletion-mode respectively as to be relatively non-conductive and relatively conductive respectively.

2. An electrically programmable latch circuit as set forth in claim 1 wherein said first programmable-threshold-voltage transistor is an n-channel gate-injection metal-insulator-semiconductor field-effect transistor with the first end of its channel at its source electrode and with the second end of its channel at its drain electrode, which connects to said first operating supply terminal, and wherein said second programmable-threshold-voltage transistor is a p-channel gate injection metal-insulator-semiconductor field-effect transistor with the first end of its channel at its source electrode and with the second end of its channel at its drain electrode, which connects to said second operating supply terminal.

3. An electrically programmable latch circuit as set forth in claim 1 wherein said first programmable-threshold-voltage transistor is a p-channel substrate-injection metal-insulator-semiconductor field-effect transistor with the first end of its channel at its source electrode, with substrate connection to said second operating supply terminal, and with the second end of its channel at its drain electrode, which connects to said second operating supply terminal, and wherein said second programmable-threshold-voltage transistor is an n-channel substrate-injection metal-semiconductor field-effect transistor with the first end of its channel at its source electrode, with a substrate connection to said first operating supply terminal, and with the second end of its channel at its drain electrode, which connects to said first operating supply terminal.

4. An electrically programmable latch circuit as set forth in claim 1 wherein said first programmable-threshold-voltage transistor is an n-channel gate-injection metal-insulator-semiconductor field-effect transistor with the first end of its channel at its drain electrode and with the second end of its channel at its source electrode, which connects to said second operating supply terminal, and wherein said second programmable-threshold-voltage transistor is a p-channel gate-injection metal-insulator-semiconductor field-effect transistor with the first end of its channel at its drain electrode and with the second end of its channel at its source electrode, which connects to said first operating supply terminal.

5. An electrically programmable latch circuit as set forth in claim 1 wherein said first programmable-threshold-voltage transistor is a p-channel substrate-injection metal-insulator-semiconductor field-effect transistor with the first end of its channel at its drain electrode, with a substrate connection to said second operating supply terminal, and with the second end of its channel at its source electrode, which connects to said first operating supply terminal, and wherein said second programmable-threshold-voltage transistor is an n-channel substrate-injection metal-insulator-semiconductor field-effect transistor with the first end of its channel at its drain electrode, with a substrate connection to said first operating supply terminal, and with the second end of its channel at its source electrode, which connects to said second operating supply terminal.

6. An electrically programmable latch circuit as set forth in claim 1 wherein said first programmable-threshold-voltage transistor is an n-channel gate-injection metal-insulator-semiconductor field-effect transistor with the first end of its channel at its source electrode and with the second end of its channel at its drain electrode, which connects to said first operating supply terminal, and wherein said second programmable-threshold-voltage transistor is an n-channel substrate-injection metal-insulator-semiconductor field-effect transistor with the first end of its channel at its drain electrode, with a substrate connection to said second operating supply terminal and with the second end of its channel at its source electrode, which connects to said second operating supply terminal.

7. An electrically programmable latch circuit as set forth in claim 1 wherein said first programmable-threshold-voltage transistor is an n-channel substrate injection metal-insulator-semiconductor field-effect transistor with the first end of its channel at the drain electrode, with a substrate connection to said second operating supply terminal, and with the second end of its channel at its source electrode, which connects to said second operating supply terminal, and wherein said second programmable-threshold-voltage transistor is an n-channel gate-injection metal-insulator-semiconductor field-effect transistor with the first end of its channel at its drain electrode and with the second end of its channel at its source electrode, which connects to said first operating supply terminal.

8. An electrically programmable latch circuit as set forth in claim 1 wherein said first programmable-threshold-voltage transistor is a p-channel substrate-injection metal-insulator-semiconductor field-effect transistor with the first end of its channel at its drain electrode, with a substrate connection to said first operating supply terminal, and with the second end of its channel at its source electrode, which connects to said first operating supply terminal, and wherein said second programmable-threshold-voltage transistor is a p-channel gate-injection metal-insulator-semiconductor field-effect transistor with the first end of its channel at its source electrode and with the second end of its channel at its drain electrode, which connects to said second operating supply terminal.

9. An electrically programmable latch circuit as set forth in claim 1 wherein said first programmable-threshold-voltage transistor is a p-channel substrate-injection metal-insulator-semiconductor field-effect transistor with the first end of its channel at its source electrode, with a substrate connection to said first operating supply terminal, and with the second end of its channel at its drain electrode, which connects to said second operating supply terminal, and wherein said second programmable-threshold-voltage transistor is a p-channel gate-injection metal-insulator-semiconductor field-effect transistor with the first end of its channel at its drain electrode and with the second end of its channel at its source electrode, which connects to said first operating supply terminal.

10. An electrically programmable latch circuit as set forth in claim 1 in combination with a transmission gate for selectively connecting first and second nodes in response to said first latch output signal, said transmission gate comprising:
 a fixed-threshold-voltage field-effect transistor having source and drain electrodes connected to respective ones of said first and second nodes and having a gate electrode to which the output terminal of said electrically programmable latch circuit connects.

11. A combination as set forth in claim 10 with said first node at the input terminal of said electrically programmable latch circuit.

12. A combination as set forth in claim 10 with said second node at the input terminal of said electrically programmable latch circuit.

13. An electrically programmable latch circuit as set forth in claim 1 in combination with a selectively activated inverter amplifier comprising:
 an inverter amplifier input connection;
 an inverter amplifier output connection; and
 a fixed-threshold-voltage field-effect transistor having gate and drain electrodes connected respectively to said inverter amplifier output connection and having a source electrode to which the output terminal of said electrically programmable latch circuit connects.

14. A combination as set forth in claim 13 wherein the input terminals of said latch circuit and of said inverter amplifier interconnect.

15. An electrically programmable latch circuit as set forth in claim 1 including:
 a complemented-output terminal from which is supplied a second latch output signal complementary to said first latch output signal; and
 means for selectively connecting said complemented-output terminal to a selected one of said first and second operating supply terminals during times of normal operation responsive to whether said programming voltages applied prior to said times of normal operation are positive or negative.

16. An electrically programmable latch circuit as set forth in claim 15 wherein said means for selectively connecting said complemented-output terminal comprises:
 an n-channel fixed-threshold field-effect transistor having a gate electrode to which potential at said output terminal is applied, having a source electrode connected to said first operating supply terminal, and having a drain electrode connected to said complemented-output terminal; and
 a p-channel fixed-threshold field-effect transistor having a gate electrode to which potential at said output terminal is applied, having a source electrode connected to said second operating supply terminal, and having a drain electrode connected to said complemented-output terminal.

17. An electrically programmable latch circuit as set forth in claim 15 wherein said means for selectively connecting said complemented-output terminal comprises:
 third and forth programmable-threshold-voltage transistors having respective channels connected at their first ends without substantial intervening elements to said complemented-output terminal and respectively connected at their second ends without substantial intervening elements to the ones of said first and second operating supply terminals to which the second ends of the channels of said first and second programmable-threshold-voltage transistors respectively connect, having respective gate electrodes connected to said input terminal, and being of types having the threshold voltages alterable responsive to said programming voltages and retentive of their threshold voltages during said times of normal operation when the differences of potential applied to said input terminal from said operating supply voltages have said substantially smaller values, said third and fourth programmable-threshold-voltage transistors being of respective types with channel conduction characteristics conditioned by positive programming voltage to be so far into enhancement-mode and depletion-mode respectively as to be relatively non-conductive and relatively conductive respectively, said third and fourth programmable-threshold-voltage transistors being of respective types with channel conduction characteristics conditioned by negative programming voltage to be far into depletion-mode and enhancement-mode respectively as to be relatively conductive and relatively non-conductive respectively.

18. An electrically programmable latch circuit as set forth in claim 15 in combination with a transmission gate for selectively connecting first and second nodes, said transmission gate comprising:
   first and second fixed-threshold-voltage transistors respectively of p-channel conduction type and of n-channel conduction type, having respective gate electrodes connected to separate ones of the output and complemented-output terminals of the electrically programmable latch circuit, having respective source electrodes respectively connected to said first node and to said second node, and having respective drain electrodes respectively connected to said second node and to said first node.

19. An electrically programmable latch circuit of the type set forth in claim 15 in combination with:
   an input terminal for said combination which connects to the input terminal for said electrically programmable latch circuit;
   an output terminal for said combination; and
   first and second fixed-threshold-voltage field effect transistors respectively of p-channel conduction type and of n-channel conduction type, having respective gate electrodes connected to separate ones of the output terminal and the complemented-output terminal of said electrically programmable latch circuit, having respective source electrodes respectively connected to separate ones of said input terminal of said combination and said output terminal of said combination, and having respective drain electrodes respectively connected to the source electrodes of each other.

20. An electrically programmable latch circuit of the type set forth in claim 15 in combination with a selectively enabled inverter amplifier comprising:
   first and second fixed-threshold-voltage field effect transistors respectively of p-channel conduction type and of n-channel conduction type having respective source electrodes connected to separate ones of the output and complemented-output terminals of the electrically programmable latch circuit, having respective gate electrodes connected to a first node that is the input connection of said selectively enabled inverter amplifier, and having respective drain electrodes connected together at a second node that is the output connection of said selectively enabled inverter amplifier.

21. An electrically programmable latch circuit of the type set forth in claim 15 in combination with:
   an input terminal for said combination to which the input terminal of the electrically programmable latch circuit connects;
   an output terminal for said combination;
   first and second fixed-threshold-voltage field effect transistors respectively of p-channel conduction type and of n-channel conduction type, having respective gate electrodes connected to the input terminal of said combination, having respective source electrodes connected to separate ones of the output and complemented-output terminals of the electrically programmable latch circuit, and having respective drain electrodes connected to the output terminal of said combination; and
   third and fourth fixed-threshold-voltage field effect transistors respectively of p-channel conductivity type and of n-channel conductivity type, having respective gate electrodes connected to the same ones of the output and complemented-output terminals of the electrically programmable latch circuit as the source electrodes of said first and second fixed-threshold-voltage field effect transistors respectively, having respective source electrodes respectively connected to separate ones of the input and output terminals of said combination, and having respective drain electrodes respectively connected to the source electrodes of each other.

22. A programmably-activated inverting amplifier stage comprising:
   an input terminal;
   an output terminal;
   first and second operating voltage terminals for receiving relatively positive and relatively negative operating voltages during times of normal operation;
   p-channel and n-channel field effect transistors of fixed-threshold-voltage type having respective gate electrodes connected to said input terminal, having respective drain electrodes connected to said output terminal, and having respective source electrodes; and
   a pair of programmable-threshold-voltage type field effect transistors, having respective channels and having control gate electrodes with an interconnection therebetween for receiving a common programming voltage during programming times, and being of types the channels of which are rendered mutually conductive responsive to one sense of programming voltage and mutually non-conductive responsive to the other sense of programming voltage, the channel of one of said pair of programmable-threshold voltage transistors being connected between said first operating voltage terminal and the source electrode of said p-channel field effect transistor of fixed-threshold-voltage type, and the channel of the other of said pair of programmable-threshold-voltage transistors being connected between said second operating voltage terminal and the source electrode of said n-channel field effect transistor of fixed-threshold voltage type.

23. A programmably-activated inverting amplifier stage as set forth in claim 22 wherein said pair of programmable-threshold-voltage field effect transistors are both substrate-injection type and are both the same conductivity type.

24. A programmably-activated inverting amplifier stage as set forth in claim 23 wherein the interconnection between the gate electrodes of said pair of programmable-threshold-voltage field effect transistors connects to said input terminal.

25. A programmably-activated inverting amplifier stage as set forth in claim 22 wherein said pair of programmable-threshold-voltage field effect transistors are both gate-injection type and are both the same conductivity type.

26. A programmably-activated inverting amplifier stage as set forth in claim 22 wherein the interconnection between the gate electrodes of said pair of programmable-threshold-voltage field effect transistors connects to said input terminal.

27. A method for programmably selectively activating an amplifier stage comprising:
 an input terminal;
 an output terminal;
 first and second operating voltage terminals for receiving relatively positive and relatively negative operating voltages during times of normal operation;
 first and second field effect transistors having respective gates with respective connections from said input terminal and having respective channels in serial connection between said first operating voltage terminal and said output signal voltage terminal; and
 third and fourth field effect transistors having respective gates with respective connections from said input terminal and having respective channels in serial connection between said second operating voltage terminal and said output signal voltage terminal, one of said first and third field effect transistors being a p-channel field effect transistor of fixed-threshold-voltage type and the other being an n-channel field effect transistor of fixed-threshold voltage type, said second and fourth field effect transistors each being of a programmable-threshold voltage type, said second and fourth field effect transistors being programmable to alter their threshold voltages to condition them for mutually increased conduction or mutually decreased conduction responsive to a common programming voltage applied to their gates via said input terminal; said method comprising the steps of:
 applying input signal voltages within a normal operating range to said input terminal, said normal operating range being so bounded that the programmable threshold voltages of said second and fourth transistors are not appreciably altered by input signal voltages within that range, and previously
 applying a programming voltage outside said normal input signal range, of such sense and amplitude whenever said amplifier stage is to be subsequently inactive as to condition said second and fourth field effect transistors to be so strongly enhancement mode in their conduction characteristics that their channels will effectively be non-conductive responsive to any input signal voltage within said normal operating range being applied to their gates via their said connections from said input terminal, and of such sense and amplitude whenever said amplifier stage is to be subsequently active as to condition said second and fourth field effect transistors to be so strongly depletion-mode in their conduction characteristics that their channels will be substantially conductive responsive to any input signal voltage within said normal operating range being applied to their gates via their connections said connections from said input terminal.

28. A method for programmably selectively activating an amplifier stage comprising an input terminal, an output terminal, first and second operating voltage terminals for receiving an operating voltage therebetween, a p-channel field effect transistor having a gate to which said input terminal connects and having a channel included in a selective connection between said output terminal and said first operating voltage terminal, and an n-channel field effect transistor having a gate to which said input terminal connects and having a channel included in a selective connection between said output terminal and said second operating voltage terminal, said method comprising the steps of:
 including, in serial connection with the channel of said p-channel field effect transistor for cooperating in providing said selective connection between said output terminal and said first operating voltage terminal, the channel of a first auxiliary field effect transistor with threshold-voltage programmable responsive to programming voltage applied between its gate and another element of its structure;
 including, in serial connection with the channel of said n-channel field effect transistor for co-operating in providing said selective connection between said output terminal and said second operating voltage termainl, the channel of a second auxiliary field effect transistor with threshold voltage programmable responsive to programming voltage applied between its gate and another element of its structure;
 applying, prior to times said amplifier stage is to be inactivated so as not to respond at its output terminal to signal voltages within a normal operating range applied to its input terminal, programming voltages to the gates of said first and second auxiliary transistors of the sense and sufficient amplitude for conditioning them to be so strongly enhancement-mode their channels will be effectively non-conductive; and
 applying, prior to times said amplifier stage is to be activated so as to respond at its output terminal to signal voltages within said normal operating range applied to its input terminal, programming voltages to the gates of said first and second auxiliary transistors of the sense and sufficient amplitude for conditioning them to be so strongly depletion-mode their channels will be substantially conductive.

* * * * *

UNITED STATES PATENT AND TRADEMARK OFFICE
CERTIFICATE OF CORRECTION

PATENT NO. : 4,596,938

DATED : June 24, 1986

INVENTOR(S) : James Murgen Cartwright, Jr.

It is certified that error appears in the above-identified patent and that said Letters Patent is hereby corrected as shown below:

Column 4, line 42, change "negative than $V_{SS}$" to --positive than $V_{DD}$--.

Signed and Sealed this

Twenty-fourth Day of March, 1987

Attest:

DONALD J. QUIGG

Attesting Officer     Commissioner of Patents and Trademarks